United States Patent [19]

Belcher et al.

[11] Patent Number: 5,041,797

[45] Date of Patent: Aug. 20, 1991

[54] MICRO-POWER GAIN LATTICE

[75] Inventors: Donald K. Belcher, Melbourne; Alexander J. Nadler, Indialantic, both of Fla.

[73] Assignee: Harris Corporation, Melbourne, Fla.

[21] Appl. No.: 615,248

[22] Filed: Nov. 19, 1990

[51] Int. Cl.⁵ .............................................. H03F 3/42
[52] U.S. Cl. .................................... 330/311; 330/296; 330/293
[58] Field of Search ................... 330/70, 71, 310, 311, 330/293, 296

[56] References Cited

U.S. PATENT DOCUMENTS 3,983,503  9/1976  Bannister et al. .................. 330/310

Primary Examiner—James B. Mullins
Attorney, Agent, or Firm—Evenson, Wands, Edwards, Lenahan & McKeown

[57] ABSTRACT

A broadband, high-gain RF signal amplifier which consumes a minimal amount of DC power has an input terminal to which an input signal to be amplified is coupled, and an output terminal from which an amplified output signal is derived. The signal amplifier has a plurality of first through $n^{th}$ signal amplification stages coupled in cascade between the input terminal and the output terminal. Each stage comprises an amplifier device having an input electrode, an output electrode and a control electrode. The output electrode is coupled to an amplifier device of an $i^{th}$ stage that is resistively coupled to the input electrode of the amplifier device of an $(i+1)^{th}$ stage, and is DC coupled through a rectifier device to the control electrode of the amplifier device of the $(i+1)^{th}$ stage. The control electrode of the amplifier device of the $i^{th}$ stage is resistively coupled to the input electrode of the amplifier device of the $(i+1)^{th}$ stage. The input terminal is coupled to the input electrode of the amplifier device of the first amplification stage, while the output terminal is coupled to the input electrode of the amplifier device of the $n^{th}$ amplification stage.

6 Claims, 2 Drawing Sheets

MICRO-POWER GAIN LATTICE

FIELD OF THE INVENTION

The present invention relates to RF amplifiers, an more specifically, to a broadband, high-gain RF amplifier that consumes a minimal amount of DC power.

BACKGROUND OF THE INVENTION

Signal amplifiers are known in which a large voltage gain at an output from a signal input is accomplished using several amplifier stages in a DC cascading arrangement. A problem with these known amplifiers is their size and the amount of power consumed by the amplifiers.

The relatively large size of the known amplifiers is due to the presence of several capacitors used for signal coupling between amplification stages. Power consumption is also higher in the known amplifiers because they are differential, thus requiring equal power in each half.

There is a need for a signal amplifier that has very low power consumption and minimal size while providing broadband, high-gain amplification of signals.

SUMMARY OF THE INVENTION

This and other needs are met by the present invention which provides a signal amplifier having an input terminal to which an input signal to be amplified is coupled, and an output terminal from which an amplified output signal is derived. The signal amplifier has a plurality of first through $n^{th}$ signal amplification stages coupled in cascade between the input terminal and the output terminal. Each stage comprises an amplifier device having an input electrode, an output electrode and a control electrode. The output electrode is coupled to an amplifier device of an i stage that is resistively coupled to the input electrode of the amplifier device of an $(i+1)^{th}$ stage, and is DC coupled through a rectifier device to the control electrode of the amplifier device of the $(i+1)^{th}$ stage. The control electrode of the amplifier device of the $i^{th}$ stage is resistively coupled to the input electrode of the amplifier device of the $(i+1)^{th}$ stage. The input terminal is coupled to the input electrode of the amplifier device of the first amplification stage, while the output terminal is coupled to the input electrode of the amplifier device of the $n^{th}$ amplification stage.

The present invention provides for low power consumption, for example, 500 microamperes at approximately 5 volts (i.e. approximately 2.5 mW). The signal amplifier of the present invention provides intrinsic broadband input impedance matching, while having a low output impedance for driving 50 ohm loads.

The present invention provides for excellent reverse isolation, does not use inductors and requires a minimum of external bypass capacitors, thereby allowing the amplifier to be miniaturized.

In an embodiment of the present invention, feedback resistors are provided so that the gain of the amplifier can be traded for increase bandwidth. For example, the addition of the feedback resistors causes the amplifier to change from having a gain of 60 dB with a bandwidth of 3-4MHz to having a gain of approximately 34 dB and a bandwidth of approximately >10MHz.

Other objects, advantages and novel features of the present invention will become apparent from the following detailed description of the invention when considered in conjunction with the accompanying drawings.

DETAILED DESCRIPTION OF THE DRAWINGS

Figure 1:
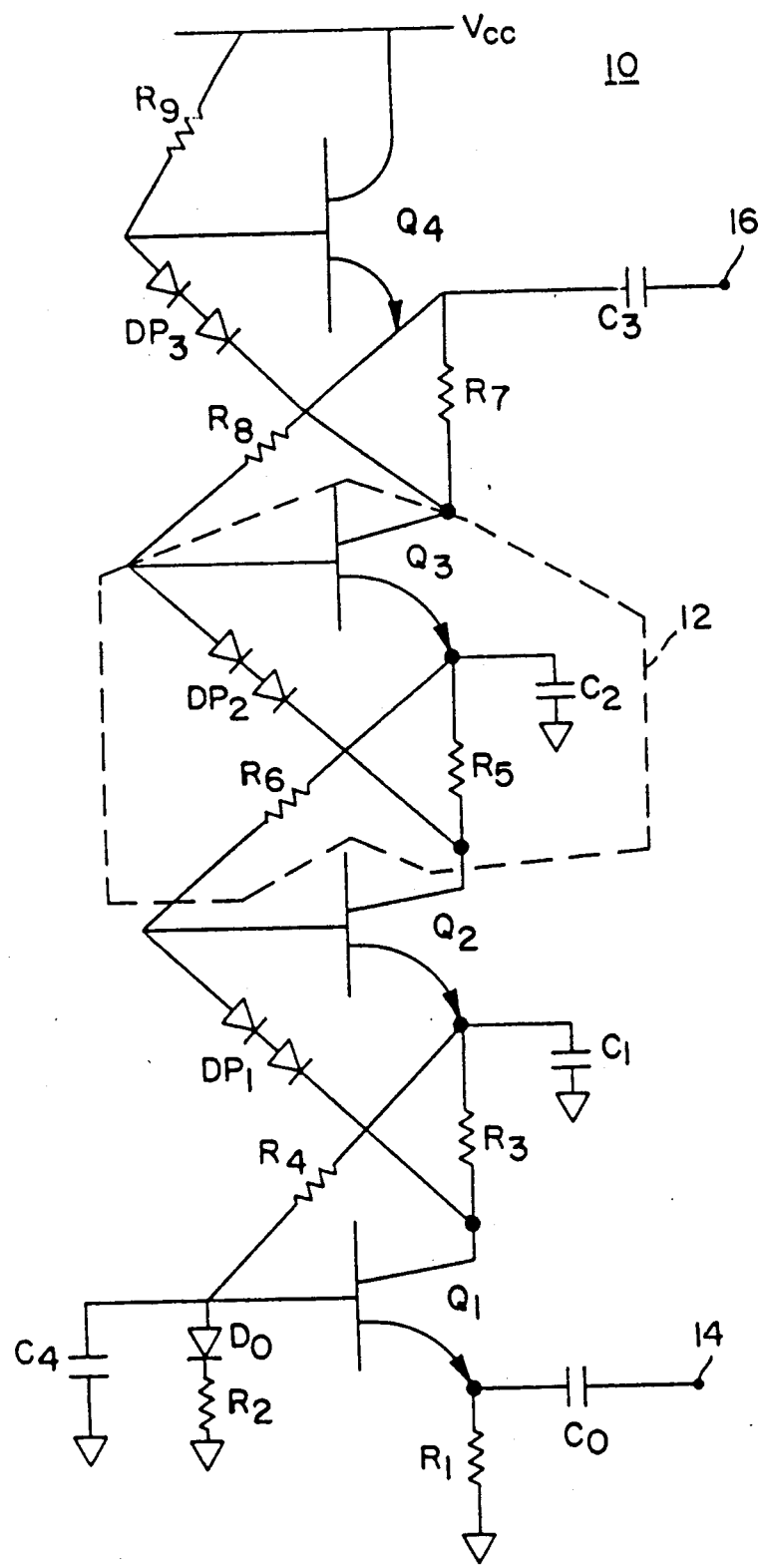
FIG. 1 is a schematic diagram of a signal amplifier constructed in accordance with an embodiment of the present invention.

FIG. 1 illustrates a signal amplifier 10 comprising a number of stackable amplifier stages 12, one of which is shown within dashed lines. The signal amplifier 10 works by what is known as "current reuse", i.e. by DC cascading several amplifier stages 12. The number of amplifier stages 12 that can be cascaded is potentially unlimited.

Each amplifier stage 12 comprises the same elements so that the same basic building block (i.e. the amplifier stage 12) can be repeated indefinitely. As seen in FIG. 1, the amplifier stage 12 comprises a transistor $Q_3$, a diode pair $DP_2$, a biasing resistor $R_6$, an isolation resistor $R_5$ and a bypass capacitor $C_2$.

The AC signals to the signal amplifier 10 are received at a signal input 14, while a voltage amplified signal is generated at a signal output terminal 16.

The function of each diode pair $DP_1$, $DP_2$, $DP_3$ is to provide a "self-bias" for the transistors $Q_1$, $Q_2$, $Q_3$. Thus, there will be two diode voltage drops from the collector of the transistor in a lower amplifier stage and the base of a transistor of an upper amplifier stage. For example, there are two diode voltage drops between the collector of transistor $Q_1$ and the base of transistor $Q_2$.

The function of the resistors $R_4$, $R_6$, $R_8$ and $R_9$ is to provide a source of current for the diode pairs $DP_3$, $DP_2$ and $DP_1$. The current in each case comes from a node that does not have an AC signal on it, in other words, an inert node. This ensures that only DC current is fed to the base of the transistors $Q_1$, $Q_2$, $Q_3$ and $Q_4$. The inert nodes are provided by the bypass capacitors $C_1$, $C_2$, $C_3$ and the $V_{cc}$ line.

The isolation resistors $R_3$, $R_5$, $R_7$ that are between each stage 12 of the signal amplifier 10 serve to stabilize the DC current in the respective transistors $Q_1$, $Q_2$, $Q_3$ while providing a non-zero AC impedance to prevent shorting of the AC signal. In other words, the collector of a transistor has to be isolated from the source of current for that diode.

The path followed by the signal to be amplified is as follows. From the input terminal 14 through capacitor $C_0$, the signal enters the emitter of transistor $Q_1$, and exits the transistor $Q_1$ through its collector. The AC signal is then provided to the base of transistor $Q_2$ through the diode pair $DP_1$. (The diode pair $DP_1$ is provided with a source of current by resistor $R_6$). The amplified AC signal is used to drive the next transistor $Q_2$, which in turn amplifies the AC signal again. This process is repeated for subsequently higher amplification stages 12. Finally, the amplified AC signal is provided at the output terminal 16. From this description, it can be seen that the signal paths on diode pairs $DP_1$, $DP_2$ and $DP_3$ criss-cross with the bias currents on resistors $R_4$, $R_6$ and $R_8$.

Since only (n−1) bypass capacitors are used where n is the number of stages, the signal amplifier 10 of the present invention can be realized or a monolithic silicon chip. This is important for miniaturization purposes.

The present invention provides very high gain performance for very little current and voltage. For example, there is a 60dB gain for 500 microamperes at 5 volts using the present invention.

Figure 2:
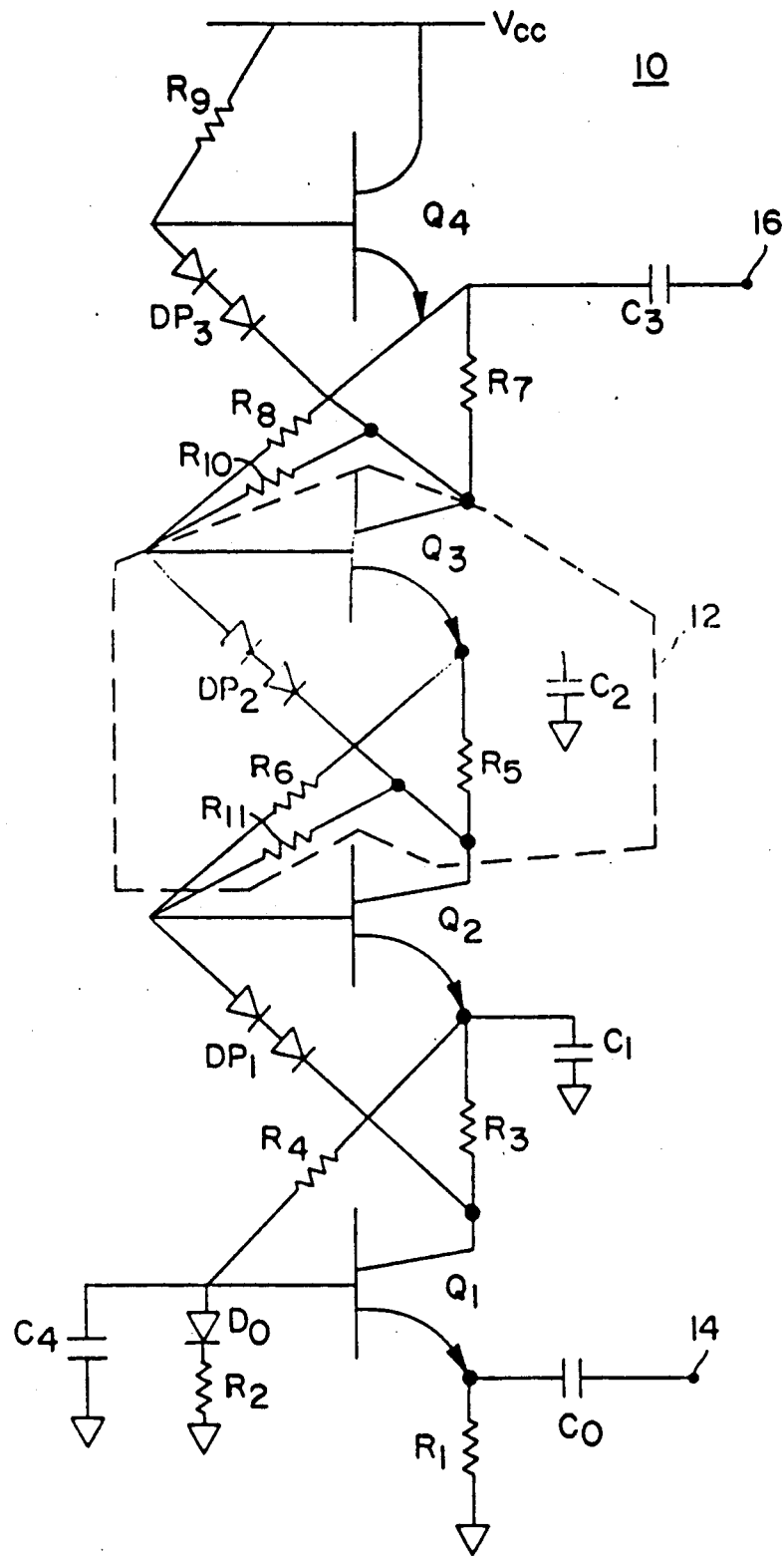
FIG. 2 is a schematic diagram of a signal amplifier constructed in accordance with another embodiment of the present invention.

FIG. 2 shows another embodiment of the invention which increases bandwidth at the cost of gain by adding feedback resistors $R_{10}$ and $R_{11}$ between stages.

The following table lists exemplary values for the resistances in the embodiment of the present invention according to FIGS. 1 and 2. These values are exemplary only and are not meant to limit the scope of the invention.

$R_1$—500Ω
$R_2$—6.8KΩ
$R_3$—1.29KΩ
$R_4$—13.2KΩ
$R_5$—1.31KΩ
$R_6$—12KΩ
$R_7$—1.31KΩ
$R_8$—12KΩ
$R_9$—9.25KΩ
$R_{10}$—16KΩ
$R_{11}$—16KΩ

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A signal amplifier comprising:
   an input terminal to which an input signal to be amplified is coupled;
   an output terminal from which an amplified output signal is derived; and
   a plurality of first through $n^{th}$ signal amplification stages coupled in cascade between said input terminal and said output terminal, each stage comprising an amplifier device having an input electrode, an output electrode and a control electrode, the output electrode of an amplifier device of an $i^{th}$ stage being resistively coupled to the input electrode of the amplifier device of an $(i+1)^{th}$ stage, and being DC coupled through a rectifier device to the control electrode of said amplifier device of said $(i+1)^{th}$ stage, the control electrode of said amplifier device of said $i^{th}$ stage being resistively coupled to the input electrode of the amplifier device of said $(i+1)^{th}$ stage; and wherein
   said input terminal is coupled to the input electrode of the amplifier device of said first amplification stage, and said output terminal is coupled to the input electrode of the amplifier device of said $n^{th}$ amplification stage.

2. A signal amplifier according to claim 1, wherein a respective amplifier device comprises a bipolar transistor, having a base corresponding to its control electrode, an emitter corresponding to its input electrode and a collector corresponding to its output electrode.

3. A signal amplifier according to claim 1, wherein said rectifier device comprises at least one diode element coupled in series between the output electrode of an amplifier device of said $i^{th}$ stage and the control electrode of an amplifier device of said $(i+1)^{th}$ stage.

4. A signal amplifier according to claim 1, further comprising respective by-pass capacitors coupled between input electrodes respectively of amplifier devices of said plurality of amplifier stages and a reference potential terminal.

5. A multiple stage power amplifier comprising:
   a first terminal to which a first voltage is applied;
   a second terminal to which a reference voltage is applied;
   a plurality of first through $n^{th}$ amplifier stages coupled in cascade between said first and second terminals, each amplifier stage comprising a transistor having an emitter, a base and a collector, the collector of an $i^{th}$ stage transistor being resistively coupled to the emitter of an $(i+1)^{th}$ stage transistor and diode-coupled to the base of said $(i+1)^{th}$ stage transistor, the base of said $i^{th}$ stage transistor being resistively coupled to the emitter of said $(i+1)^{th}$ stage transistor, the emitter of the first stage transistor being coupled to said second terminal, the collector of the $n^{th}$ stage transistor being coupled to said first terminal;
   an input terminal to which an input signal to be amplified is applied, coupled to the emitter of one of said stage transistors; and
   an output terminal, from which an amplified output signal is derived, coupled to the emitter of another of said stage transistors.

6. A multi-stage amplifier according to claim 5, wherein said input terminal is coupled to the emitter of the first stage transistor and said output terminal is coupled to the emitter of the $n^{th}$ stage transistor.

* * * * *